(12) United States Patent
Fowler

(10) Patent No.: US 9,412,782 B2
(45) Date of Patent: Aug. 9, 2016

(54) IMAGING ARRAY WITH IMPROVED DYNAMIC RANGE UTILIZING PARASITIC PHOTODIODES WITHIN FLOATING DIFFUSION NODES OF PIXELS

(71) Applicant: BAE Systems Imaging Solutions, Inc., Milpitas, CA (US)

(72) Inventor: Boyd Fowler, Sunnyvale, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 370 days.

(21) Appl. No.: 13/936,974

(22) Filed: Jul. 8, 2013

(65) Prior Publication Data

US 2015/0008307 A1    Jan. 8, 2015

(51) Int. Cl.
| | |
|---|---|
| *H01J 40/14* | (2006.01) |
| *H01L 27/00* | (2006.01) |
| *H01L 27/146* | (2006.01) |

(52) U.S. Cl.
CPC .... *H01L 27/14654* (2013.01); *H01L 27/14609* (2013.01); *H01L 27/14643* (2013.01); *H01L 27/14656* (2013.01)

(58) Field of Classification Search
CPC .......... H01L 27/14656; H01L 27/14612; H01L 27/146; H01L 27/14601; H01L 27/14643; H01L 27/14654
USPC .......... 250/208.1, 214 R, 214.1, 214 C; 257/257, 258, 290, 291, 431, 445, 461, 257/438; 348/297, 298, 299, 308, 310, 309
See application file for complete search history.

(56) References Cited

U.S. PATENT DOCUMENTS

| | | | |
|---|---|---|---|
| 6,570,144 B1 | 5/2003 | Lee et al. | |
| 7,105,793 B2* | 9/2006 | Rhodes | H01L 27/14627 250/208.1 |
| 7,554,170 B2* | 6/2009 | Raynor | H04N 3/155 257/113 |
| 2004/0096124 A1* | 5/2004 | Nakamura | H04N 5/35554 382/308 |
| 2006/0266922 A1* | 11/2006 | McGrath | H01L 27/14609 250/208.1 |
| 2007/0080413 A1 | 4/2007 | Kwak | |
| 2009/0002528 A1* | 1/2009 | Manabe | H04N 5/2355 348/248 |
| 2009/0057735 A1* | 3/2009 | Beak | H01L 27/14603 257/292 |
| 2011/0192959 A1 | 8/2011 | Hynecek | |
| 2011/0216231 A1 | 9/2011 | Fowler | |
| 2012/0097842 A1 | 4/2012 | Wan et al. | |

FOREIGN PATENT DOCUMENTS

EP    2 109 306 A2    10/2009

OTHER PUBLICATIONS

PCT/US2014/044493, International Search Report.

\* cited by examiner

*Primary Examiner* — Pascal M Bui Pho
*Assistant Examiner* — Jennifer Bennett
(74) *Attorney, Agent, or Firm* — Calvin B. Ward

(57) ABSTRACT

A pixel sensor having a main photodetector and a parasitic photodiode and a method for reading out that pixel sensor are disclosed. The pixel sensor is read by reading a first potential on a floating diffusion node in the pixel sensor while the floating diffusion node is isolated from the main photodiode. The pixel sensor is then exposed to light such that the floating diffusion node and the photodetector are both exposed to the light. A second potential on the floating diffusion node is then readout while the floating diffusion node is isolated from the main photodiode. After the first and second potentials are readout, a third potential on the floating diffusion node is readout. The main photodiode is then connected to the floating diffusion node, and a fourth potential on the floating diffusion node is readout. First and second light intensities are determined from the readout potentials.

10 Claims, 5 Drawing Sheets

IMAGING ARRAY WITH IMPROVED DYNAMIC RANGE UTILIZING PARASITIC PHOTODIODES WITHIN FLOATING DIFFUSION NODES OF PIXELS

BACKGROUND OF THE INVENTION

CMOS imaging sensors are widely used in cameras and other imaging applications. The imaging sensors typically include a two-dimensional array of pixel sensors. Each pixel sensor includes a photodiode that measures the image intensity at a corresponding point in the image. The dynamic range of the image sensor is the ratio of the minimum amount of light that can be measured to the maximum amount. An image is formed by first emptying the photodiodes of any accumulated charge and then exposing the photodiodes to the image. Each photodiode accumulates charge at a rate determined by the light intensity emitted by the image at the corresponding point in the image, referred to as a pixel. In general, the amount of charge that can be accumulated in a photodiode has a maximum value, referred to as the maximum well capacity. Once this capacity is reached, the excess charge is removed from the pixel through a special gate that shunts the excess charge to ground to prevent artifacts in the image. The minimum charge that can be detected is determined by noise.

In principle, the maximum well capacity can be increased by utilizing larger photodiodes; however, this solution increases the cost of the imaging array and requires processing electronics that can deal with the larger dynamic range of the signals generated by the pixels. Another prior art solution for increasing the dynamic range of the imaging array involves using two different photodiodes for each pixel. In this solution, a large area photodiode is used to measure low light levels and a smaller photodiode is used to measure intensities at the brighter locations in the image. If the pixel is exposed to a high brightness location, the smaller photodiode is used. At dim locations in the image, the larger photodiode is used. This solution requires two different sets of photodiodes and the increased silicon area associated with the additional photodiodes that measure the high brightness locations in the image.

A second prior art solution uses multiple exposures to provide the increased dynamic range. In this solution, basically two pictures are taken of each scene. A first picture uses a very short exposure time which captures the intensities of the high brightness points in the image. Pixels at low intensity points in the image are underexposed. The second picture uses a much longer exposure period. In the second picture, the pixels at the high intensity points are overexposed, while the pixels at the low intensity points are now adequately exposed and provide the intensity values at the low intensity points. The two pictures are then combined to provide an image with increased dynamic range. This approach, however, leads to artifacts in the image, as the two pictures are separated in time by an amount that can be a problem if the scene is rapidly changing.

SUMMARY OF THE INVENTION

The present invention includes a pixel sensor having a main photodiode and a parasitic photodiode and a method for reading out that pixel sensor. In the method for reading the pixel sensor, a first potential on a floating diffusion node in the pixel sensor is read while the floating diffusion node is isolated from the main photodiode. The pixel sensor is then exposed to light such that the floating diffusion node and the main photodetector are both exposed to the light. A second potential on the floating diffusion node is then readout while the floating diffusion node is isolated from the main photodiode. A first light intensity is determined from the first and second potentials. After the first and second potentials are readout, a third potential on the floating diffusion node is readout. The main photodiode is then connected to the floating diffusion node, and a fourth potential on the floating diffusion node is readout. A second light intensity is determined from the third and fourth potentials.

In one aspect of the invention, the floating diffusion node is connected to a reset bus having a first reset potential and then disconnected from the reset bus prior to reading the first potential. In another aspect of the invention, the floating diffusion node is connected to the reset bus and then disconnected from the reset bus after the second potential is readout and prior to reading the third potential.

In another aspect of the present invention, photoelectrons are shunted from the main photodiode to ground if a potential on the photodiode exceeds an overflow potential.

A pixel sensor according to the present invention includes a main photodiode characterized by a first light conversion efficiency, a floating diffusion node, a gate that selectively connects the main photodiode to the floating diffusion node, a readout amplifier that generates a signal indicative of a potential on the floating diffusion node, the signal being coupled to a first conductor in response to a select signal received by the pixel sensor; and a reset gate that selectively connects the floating diffusion node to a reset bus at a reset potential. The floating diffusion node includes a parasitic photodiode characterized by a second light conversion efficiency, the first light conversion efficiency is greater than or equal to 30 times the second light conversion efficiency.

In one aspect of the present invention, the pixel sensor includes an overflow gate connected to the main photodiode. The overflow gate removes charge from the photodiode if a potential on the photodiode exceeds an overflow potential.

In another aspect of the invention, the floating diffusion node includes an n-type implanted region in a p-type semiconductor substrate. The main photodiode also includes an n-type implanted region in the p-type substrate. A portion of the n-type implanted region of the floating diffusion node is in direct contact with the p-type substrate, the size of that portion being adjusted to provide the second light conversion efficiency.

The present invention also includes imaging arrays constructed from the pixel sensors of the present invention or readout using the method of the present invention.

DETAILED DESCRIPTION OF THE INVENTION

Figure 1:
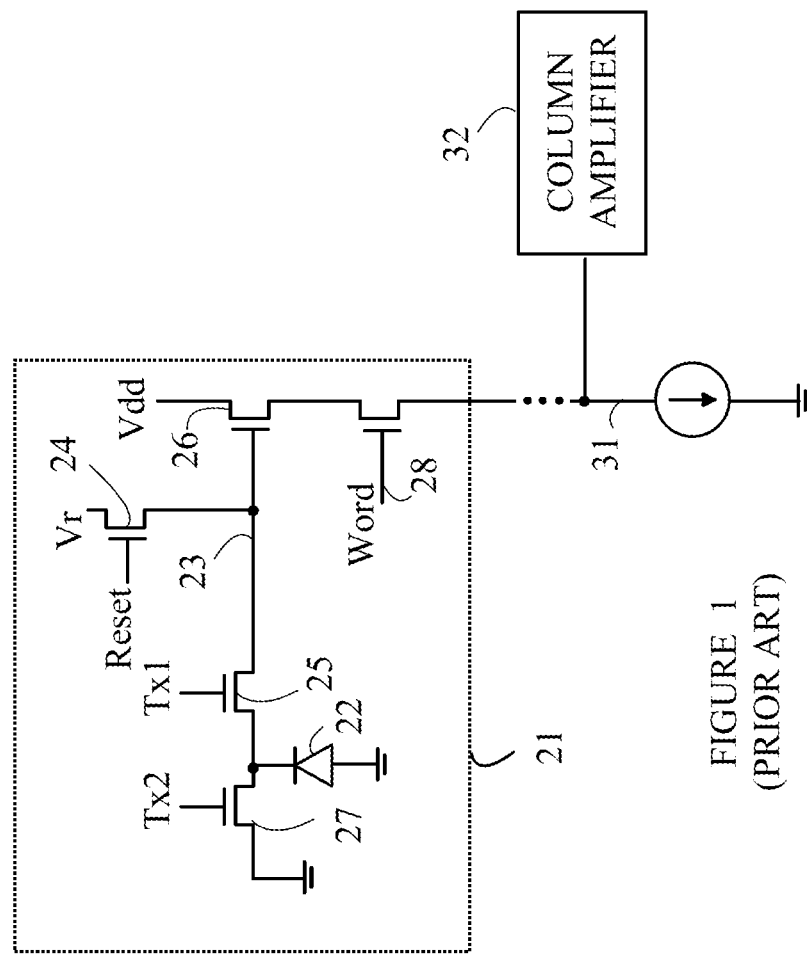
FIG. 1 is a schematic drawing of a typical prior art pixel sensor in one column of pixel sensors in an imaging array.

The manner in which the present invention provides its advantages can be more easily understood with reference to FIG. 1, which is a schematic drawing of a typical prior art pixel sensor in one column of pixel sensors in an imaging array. Pixel sensor 21 includes a photodiode 22 that measures the light intensity at a corresponding pixel in the image. Initially, photodiode 22 is reset by placing gate 25 in a conducting state and connecting floating diffusion node 23 to a reset voltage, Vr. Gate 25 is then closed and photodiode 22 is allowed to accumulate photoelectrons. A potential on gate 27 sets the maximum amount of charge that can be accumulated on photodiode 22. If more charge is accumulated than allowed by the potential on gate 27, the excess charge is shunted to ground through gate 27.

After photodiode 22 has been exposed, the charge accumulated in photodiode 22 is then measured using a correlated double sampling algorithm. In this algorithm, floating diffusion node 23 is first reset to Vr using reset gate 24. The potential on floating diffusion node 23 is then measured by connecting source follower 26 to readout line 31 using the gate connected to line 28. This reset potential is stored in column amplifier 32. Next, gate 25 is placed in a conducting state and the charge accumulated in photodiode 22 is transferred to floating diffusion node 23. It should be noted that floating diffusion node 23 is effectively a capacitor that has been charged to Vr. Hence, the charge leaving photodiode 22 lowers the voltage on floating diffusion node 23 by an amount that depends on the capacitance of floating diffusion node 23 and the amount of charge that is transferred. The voltage on floating diffusion node 23 is again measured after the transfer. The difference in voltage is then used to compute the amount of charge that accumulated during the exposure.

Figure 2:
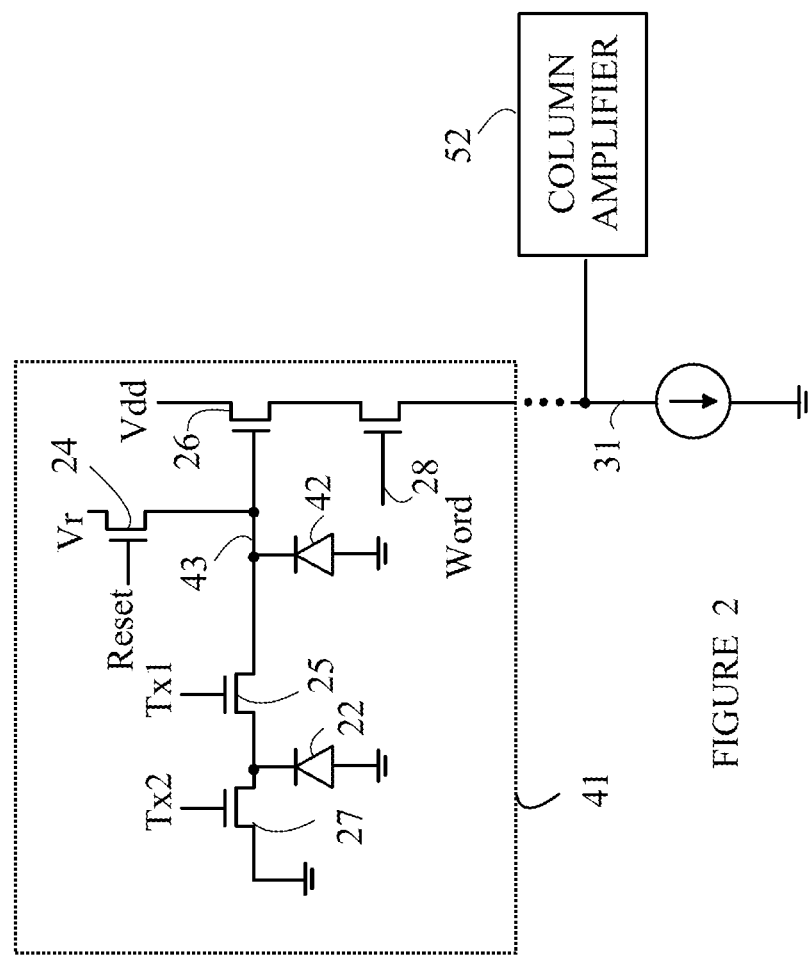
FIG. 2 illustrates a pixel sensor in which the parasitic photodiode is utilized in an image measurement.

The present invention is based on the observation that a pixel of the type discussed above can be modified to include a second parasitic photodiode that is part of the floating diffusion node and has a significant photodiode detection efficiency. To distinguish the parasitic photodiode from photodiode 22, photodiode 22 and photodiodes serving analogous functions will be referred to as the "conventional photodiode". Refer now to FIG. 2, which illustrates a pixel sensor in which the parasitic photodiode is utilized in an image measurement. To simplify the following discussion, those elements of pixel sensor 41 that serve functions analogous to those discussed above with respect to FIG. 1 have been given the same numeric designations and will not be discussed further unless such discussion is necessary to illustrate a new manner in which those elements are utilized. In general, parasitic photodiode 42 has a detection efficiency that is significantly less than that of main photodiode 22. The manner in which the ratio of the photodiode detection efficiencies of the two photodiodes is adjusted will be discussed in more detail below.

The manner in which pixel sensor 41 is utilized to measure the intensity of a pixel will now be explained in more detail. The process may be more easily understood starting from the resetting of the pixel after the last image readout operation has been completed. Initially, main photodiode 22 is reset to Vr and gate 25 is closed. This also leaves floating diffusion node 43 reset to Yr. This voltage is measured at the start of the exposure by connecting floating diffusion node 43 to column amplifier 52. During the image exposure, parasitic photodiode 42 generates photoelectrons that are stored on floating diffusion node 43. These photoelectrons lower the potential on floating diffusion node 43. At the end of the exposure, the voltage on floating diffusion node 43 is again measured by connecting the output of source follower 26 to column amplifier 52, and the amount of charge generated by parasitic photodiode 42 is determined to provide a first pixel intensity value. Next, floating diffusion node 43 is again reset to Vr and the potential on floating diffusion node 43 is measured by connecting the output of source follower 26 to column amplifier 52. Gate 25 is then placed in the conducting state and the photoelectrons accumulated by main photodiode 22 are transferred to floating diffusion node 43. The voltage on floating diffusion node 43 is then measured again and used by column amplifier 52 to compute a second pixel intensity value.

If the light intensity on the corresponding pixel was high, main photodiode 22 will have overflowed; however, parasitic photodiode 42, which has a much lower conversion efficiency, will have a value that is within the desired range. On the other hand, if the light intensity was low, there will be insufficient photoelectrons accumulated on parasitic photodiode 42 to provide a reliable estimate, and the measurement from main photodiode 22 will be utilized.

The above-described readout strategy assumes that the ratio of the light detection efficiency of main photodiode 22 and parasitic photodiode 42 is adjusted such that the values obtained from parasitic photodiode 42 are complementary to those obtained from main photodiode 22. If parasitic photodiode 42 has too low a light detection efficiency, the intensity values obtained from parasitic photodiode 42 when main photodiode 22 has become saturated will be too low or too noisy to be useful. Similarly, if the light detection efficiency of parasitic photodiode 42 is too high, a useful extension of the dynamic range of the pixel sensor will not be achieved.

Figure 3:
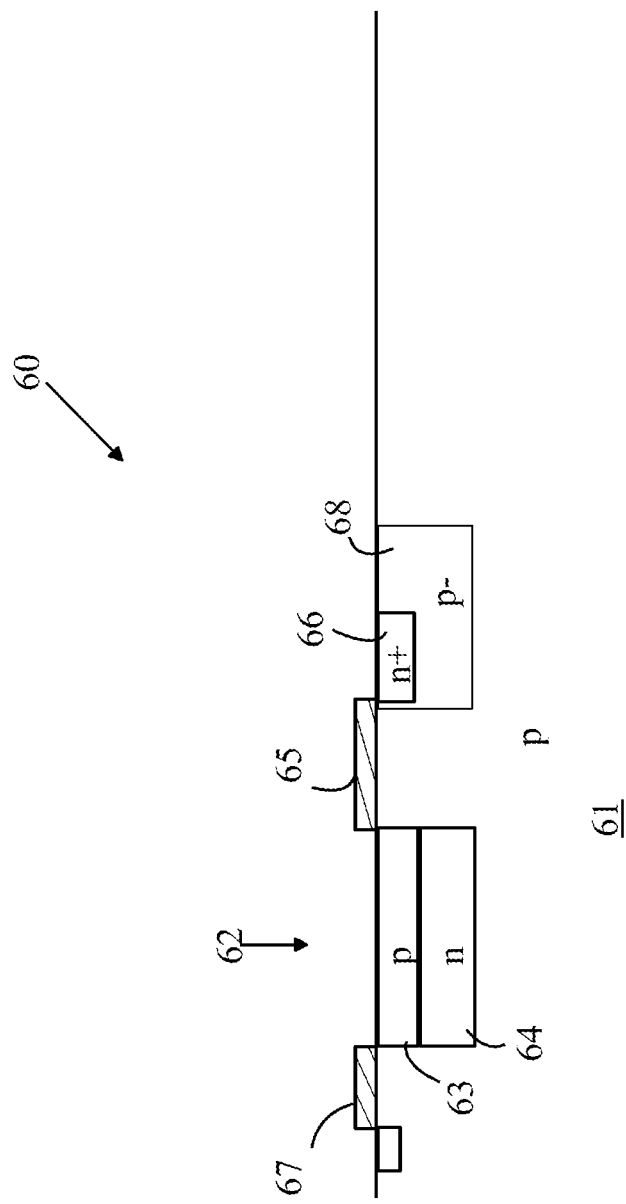
FIG. 3 is a cross-sectional view through a portion of a typical prior art pixel sensor.

Refer now to FIG. 3, which is a cross-sectional view through a portion of a typical prior art pixel sensor. To simplify the drawing, a number of implants that are not central to the present invention have been omitted. Pixel sensor 60 is fabricated in a p-type substrate 61. Main photodiode 62 is a pinned photodiode and is constructed from a p-implant 63 at the surface of p-type substrate 61 and an n-implant 64. The p-implant reduces the dark current. The photodiode junction is the junction between n-implant 64 and p-type substrate 61. The gate electrodes corresponding to gates 25 and 27 are shown at 65 and 67, respectively. Floating diffusion node 68 includes an n+ implant 66 that is surrounded by a p-implanted region. The difference in doping between p-type substrate 61 and region 68 provides a potential barrier that reduces the light collection efficiency of the parasitic photodiode formed by implant 66 and p-type substrate 61. This difference inhibits electrons and holes generated in p-type substrate 61 from being collected by the parasitic photodiode. Prior art pixel sensors are designed to reduce or eliminate the parasitic photodiode action. The present invention provides its advantages by increasing this parasitic photodiode effect so as to provide a usable second photodiode in each pixel sensor without substantially increasing the size of the pixel sensors.

Figure 4:
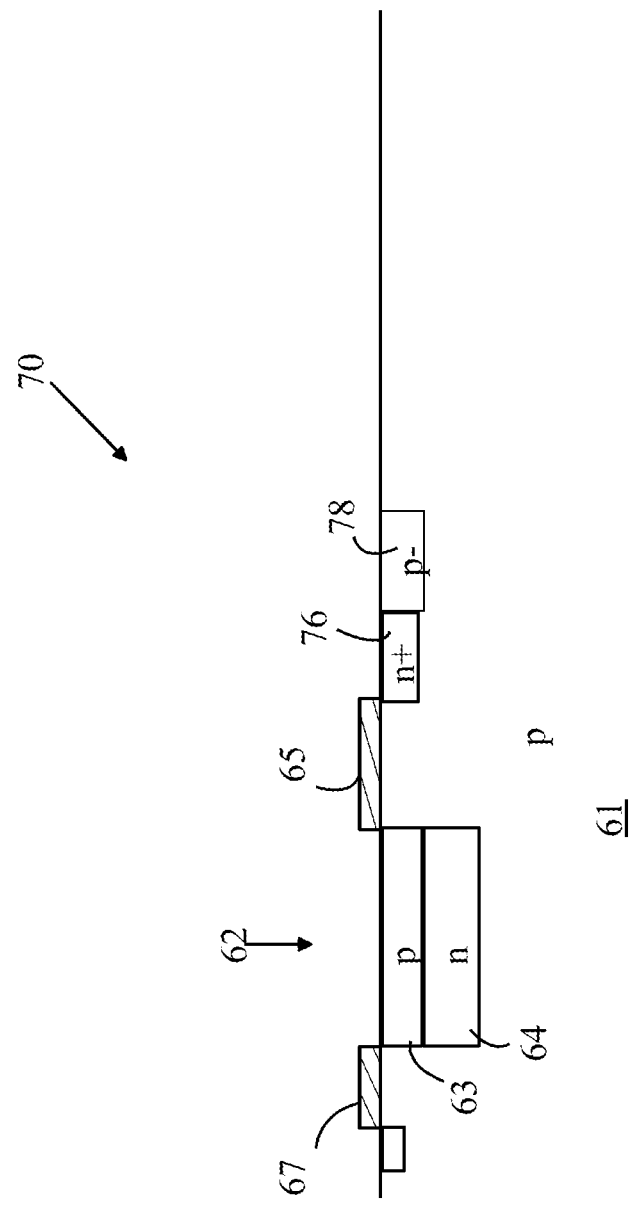
FIG. 4 is a cross-sectional view of a portion of a pixel sensor according to one embodiment of the present invention.

Refer now to FIG. 4, which is a cross-sectional view of a portion of a pixel sensor according to one embodiment of the present invention. To simplify the following discussion, those elements of pixel sensor 70 that serve functions analogous to those served by elements in FIG. 3 have been given the same numeric designations and will not be discussed in detail again. In pixel sensor 70, the p-implant 78 associated with implant region 76 that forms the floating diffusion node has been removed from at least a portion of implant region 76. Hence, the parasitic photodiode formed by implant region 76 in p-type substrate 61 has a depletion region that extends into p-type substrate 61. Accordingly, the photoelectron collection efficiency of the parasitic photodiode is substantially increased. It should be noted that this increase in efficiency is obtained without substantially altering the size of implant region 76, and hence, the second main photodiode is provided without substantially increasing the size of the pixel sensor.

The light conversion efficiency of the parasitic photodiode can be adjusted by adjusting the area of the interface between n+ implant region 76 and p-type substrate 61. The light conversion efficiency can be reduced by leaving a p– implant that partially covers the bottom surface of implant region 76. The light conversion efficiency can be increased by increasing the size of implant region 76 or by increasing the reset voltage on n+ implant region 76 during the exposure.

Increasing the size of the n+ implant region is not, however, preferred. The charge-to-voltage conversion gain of the source pixel sensor depends on the capacitance associated with the floating diffusion node. If the capacitance is increased, the charge-to-voltage conversion gain is reduced. In general, a high charge-to-voltage conversion gain is desired; hence, increasing the size of the floating diffusion node is not preferred. The size of the depletion region associated with the parasitic photodiode can be increased by increasing the voltage on implant region 76 during the exposure. However, there is a maximum voltage that is set by the semiconductor process and the complexities of providing different reset voltages for the main photodiode and the parasitic photodiode.

However, using one or more of the above described factors, a useful range for the ratio of the light conversion efficiencies of the main photodiode and parasitic photodiode can be obtained. In general, there is a light intensity-exposure time at which the main photodiode saturates. For exposures that are greater than this exposure, the additional photoelectrons are removed from the photodiode, and hence, the output of the main photodiode does not change with additional exposure. This exposure will be referred to as the main photodiode saturation exposure in the following discussion. The light collection efficiency of the parasitic photodiode is preferably set such that sufficient photoelectrons are generated in the parasitic photodiode at the main photodiode saturation exposure to provide a good measurement of the light intensity for exposures at or greater than the main photodiode saturation exposure up to some upper exposure limit, and hence, the resulting pixel sensor will have an improved dynamic range compared to a pixel sensor that does not utilize such a parasitic photodiode.

The optimum ratio between the light conversion efficiencies of the main photodiode and the parasitic photodiode will depend on the noise levels in the parasitic photodiode. In general, the noise level in the parasitic photodiode will be greater than that in the main photodiode, since the parasitic photodiode is not a pinned photodiode. Hence, a greater exposure will be needed to provide a pixel intensity measurement with some predetermined signal-to-noise ratio. In addition, the light conversion efficiency of the parasitic photodiode must be less than that at which the capacity of the parasitic photodiode to hold the charge is exceeded to prevent image artifacts such as blooming when a few pixels have very high exposures. In one aspect of the invention, the light conversion efficiency of the parasitic photodiode is less than 1/30th of the light conversion efficiency of the main photodiode.

Figure 5:
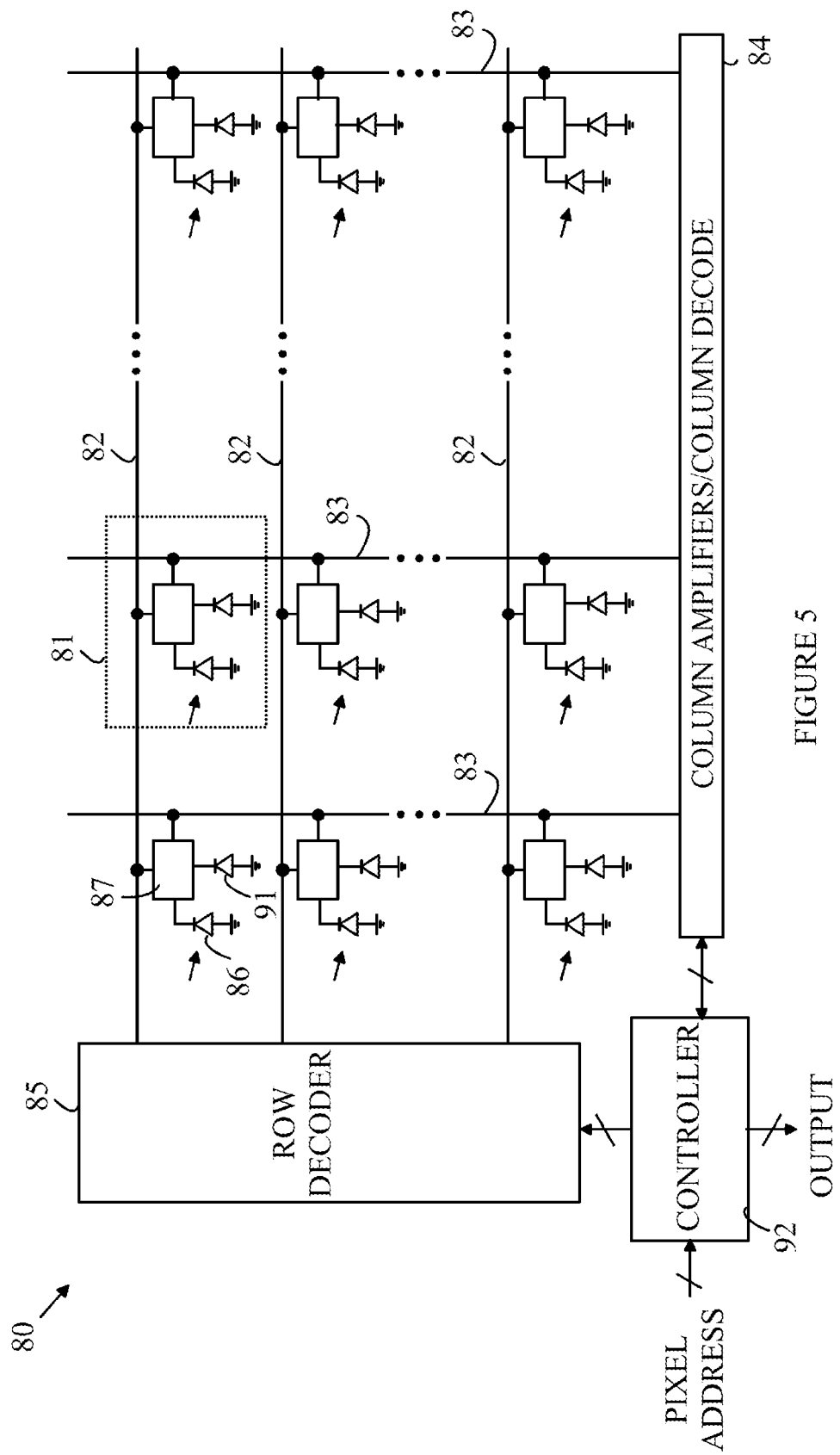
FIG. 5 illustrates a two-dimensional imaging array constructed from pixel sensors according to the present invention.

A pixel sensor according to the present invention can be utilized in a number of different camera or light sensing operations. Refer now to FIG. 5, which illustrates a two-dimensional imaging array constructed from pixel sensors according to the present invention. Imaging array 80 includes a two dimensional array of pixel sensors 81. Each pixel sensor has a main photodiode 86 and a parasitic photodiode 91 and operates in a manner analogous to that discussed above. The reset circuitry and amplification circuitry in each pixel is shown at 87. The pixel sensors are arranged as a plurality of rows and columns. Each pixel sensor in a column is connected to a readout line 83 that is shared by all of the pixel sensors in that column. The readout lines are analogous to readout line 31 shown in FIG. 2. Each pixel sensor in a row is connected to a row select line 82 which determines which pixel sensor in that row is connected to the corresponding readout line. For example, the row select line can be connected to line 28 shown in FIG. 2.

The operation of imaging array 80 is controlled by a controller 92 that receives a pixel address to be readout. Controller 92 generates a row select address that used by row decoder 85 to enable the readout of the pixel sensors on a corresponding row in imaging array 80. The column amplifiers are included in an array of column amplifiers 84 which execute the readout algorithm discussed above. It should be noted that if readout time is not critical, a single readout amplifier could be shared between the various readout lines, the currently active readout line being determined by a column decoder or multiplexer.

The imaging array shown in FIG. 5 is an exemplary imaging array. It is to be understood, that other imaging array configurations that utilize the pixel sensors of the present invention could also be constructed. For example, a one-dimensional imaging array that includes a single column of pixels could be constructed for use in a scanner in which the image is swept past the column of pixel sensors in a direction perpendicular to that of the columns of pixel sensors.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A pixel sensor comprising:
    a photodiode characterized by a first light conversion efficiency and a main photodiode saturation exposure;
    a floating diffusion node;
    a gate that selectively connects said photodiode to said floating diffusion node;
    a readout amplifier that generates a signal indicative of a potential on said floating diffusion node, said signal being coupled to a first conductor in response to a select signal being received by said pixel sensor; and
    a reset gate that selectively connects said floating diffusion node to a reset bus at a reset potential, wherein
    said floating diffusion node comprises a parasitic photodiode characterized by a second light conversion efficiency, said first light conversion efficiency being greater than or equal to 30 times said second light conversion efficiency and said second light conversion efficiency being sufficient to measure light exposures greater than said main photodiode saturation exposure.

2. The pixel sensor of claim 1 further comprising an overflow gate connected to said photodiode, said overflow gate removing charge from said photodiode if a potential on said photodiode exceeds an overflow potential.

3. The pixel sensor of claim 1 wherein said floating diffusion node comprises an n-type implanted region in a p-type semiconductor substrate.

4. The pixel sensor of claim 1 wherein said photodiode comprises an n-type implanted region in a p-type substrate.

5. The pixel sensor of claim 1 wherein said photodiode is a pinned photodiode.

6. An imaging array comprising a plurality of pixel sensors connected to a readout line, said pixel sensors comprising:
- a photodiode characterized by a first light conversion efficiency and a main photodiode saturation exposure;
- a floating diffusion node;
- a gate that selectively connects said photodiode to said floating diffusion node;
- a readout amplifier that generates a signal indicative of a potential on said floating diffusion node, said signal being coupled to a first conductor in response to a select signal being received by said pixel sensor;
- a reset gate that selectively connects said floating diffusion node to a reset bus at a reset potential; and
- a readout gate that connects that pixel sensor to said readout line, wherein
- said floating diffusion node comprises a parasitic photodiode characterized by a second light conversion efficiency, said first light conversion efficiency being greater than or equal to 30 times said second light conversion efficiency and said second light conversion efficiency being sufficient to measure light exposures greater than said main photodiode saturation exposure.

7. The imaging array of claim 6 further comprising an overflow gate connected to said photodiode, said overflow gate removing charge from said photodiode if a potential on said photodiode exceeds an overflow potential.

8. The imaging array of claim 6 wherein said floating diffusion node comprises an n-type implanted region in a p-type semiconductor substrate.

9. The imaging array of claim 6 wherein said photodiode comprises an n-type implanted region in a p-type substrate.

10. The imaging array of claim 6 wherein said photodiode is a pinned photodiode.

* * * * *